United States Patent [19]

De Leva et al.

[11] Patent Number: 5,784,551
[45] Date of Patent: Jul. 21, 1998

[54] DUPLICATE CONTROL AND PROCESSING UNIT FOR TELECOMMUNICATIONS EQUIPMENT

[75] Inventors: Carlo De Leva, Monza; Maurizio Zambardi, Cassina De' Pecchi, both of Italy

[73] Assignee: Siemens Telecomunicazioni S.p.A., Milan, Italy

[21] Appl. No.: 411,686

[22] PCT Filed: Sep. 15, 1993

[86] PCT No.: PCT/EP93/02496

§ 371 Date: Mar. 30, 1995

§ 102(e) Date: Mar. 30, 1995

[87] PCT Pub. No.: WO94/08292

PCT Pub. Date: Apr. 14, 1994

[30] Foreign Application Priority Data

Sep. 30, 1992 [IT] Italy .................... MI92 A 002261

[51] Int. Cl.⁶ ........................................ G06F 11/20
[52] U.S. Cl. ........................................ 395/182.11
[58] Field of Search .................. 395/182.11, 182.04

[56] References Cited

U.S. PATENT DOCUMENTS 5,251,299 10/1993 Masuda et al. ............. 395/182.08
5,303,243 4/1994 Anezaki ..................... 395/182.11

OTHER PUBLICATIONS

Microsoft Press, Computer Dictionary, 1994, p. 332.

*Primary Examiner*—Phung Chung
*Assistant Examiner*—P. Vales
*Attorney, Agent, or Firm*—Herbert L. Lerner; Laurence A. Greenberg

[57] ABSTRACT

A duplicate control and processing unit for telecommunications equipment consisting of two identical control units connected together is described. Each control unit (UC0, UC1) comprises a processing unit (UP0, UP1) which can be active or on standby, a peripheral data random access memory (RAM) for data processed during operation, and several peripheral circuits connected to the rest of the equipment. An EPROM (erasable programmable read-only memory) (CCL0, CCL1) in each processing unit contains the copy selection firmware. The data RAM and the peripheral circuits include a respective double gate access circuit (ACC0, ACC1) which allows selective access to the active processor only. The latter performs the writing cycles synchronously on both the duplicate data RAMs, allowing fast recovery of the operative synchronism by the standby processing unit, after switching due to failure of the active processing unit (FIG. 2).

6 Claims, 4 Drawing Sheets

DUPLICATE CONTROL AND PROCESSING UNIT FOR TELECOMMUNICATIONS EQUIPMENT

DESCRIPTION

The present invention relates to the field of processing control systems and more specifically to a duplicate control and processing unit for telecommunications equipment.

For the sake of simplicity the control and processing unit is indicated hereinafter only as the control unit.

As known, the great success of microprocessors has greatly facilitated implementation of the control unit for telecommunications equipment having even considerable complexity, as for example telephone equipment. It can also be stated that, thanks to microprocessors, the hardware design of a control unit is today nearly independent of the peculiarities of the equipment which said units supervise. Indeed, in the greater part of the known examples of microprocessor control units operating in equipment having a certain complexity, the control unit generally comprises:

- a processing unit which performs the processing necessary for operation and control of the equipment,
- a RAM bank containing the data which characterise the equipment and those processed during normal operation thereof,
- peripheral circuits which complete the processing unit and include interfaces between the processing unit and the rest of the equipment. The latter can be in turn all or partly duplicated.

The processing unit can be more or less sophisticated but in turn generally includes: of course a microprocessor with the appropriate integrated circuits which co-operate with it in some functions, as for example the management of interrupts, direct access to the memory, etc.; a RAM containing the programmes for control of the entire set of equipment; an optional circuit generating parity bits on the signals which transit through the microprocessor bus; and finally a diagnostic circuit which detects access errors of the processor and processes the alarms of the equipment generated in case of failure. In some cases the processing unit includes two or more optionally synchronised microprocessors.

The designation 'peripheral circuits' extends as known generally to all the circuits which equip the processing unit and convert it into an actual control unit, i.e.:

- mass memory and related interface circuits toward the processing unit,
- input/output terminals for data and related circuits for interfacing and extension of the processor bus,
- circuits for interfacing toward the remaining parts of the system which characterise more specifically the type of equipment, such as for example telephones or multiplex PCM for telephone exchanges,
- under the above definition of peripheral circuit it is therefore reasonable to include also the data RAM mentioned above together with the related interfacing circuits towards the processing unit.

It is also known that a microprocessor control unit exerts its control action on the equipment by means of selective writing operations of particular bit configurations into special registers for control of the equipment called 'control points', and selective reading operations from special state registers called 'sense points'. Writing of the control points serves to control certain operational modes of the various parts which make up the equipment, while reading of the sense points serves the control unit to verify the operating state thereof.

In the last decade, particularly in the telecommunications industry, equipment characterised by high reliability and availability, produced as known by the introduction of redundancy criteria, has become more and more requested. One of said criteria, which has found greater application in practice consists of duplicating the entire control unit. The duplication involves necessarily also the code and data on which the individual processing units operate.

While duplication of the control unit contributes considerably to better reliability of equipment, it brings problems which are not found in an unduplicated control unit. These problems are principally due to the fact that there are available two processors for which it is essential to define the roles, the criteria which control the separation of duties, and the procedures for switching between them in the presence of a failure to allow one processor to take over the work carried out up to that moment by the other.

Another problem due to duplication of the control unit is that of defining how the two processors are interconnected to the rest of the equipment.

In the majority of known examples, one of the two copies of the control unit is designated the active copy, to which is entrusted the task of supervising the rest of the equipment, while the other copy is held on standby and replaces the first in case of failure thereof.

Replacement is done by a selector controlled appropriately in case of failure, which prevents the copy of the failed control unit from accessing the rest of the equipment and allowing access to the previously-standby copy.

As seen from the above, some shortcomings of the duplicate control units of known type already appear evident. A first shortcoming is due to the fact that even a single failure of a certain importance, whose negative effects are such as to not be neutralised in a timely manner by the software, precludes the possibility of continuing to operate for an entire copy of the control unit.

A second shortcoming is due to the loss of real processing time of the active processor after switching between the two copies due to failure. Indeed, immediately after the switching instant, the problem of synchronisation of the structures of the data in the data RAM of the two copies arises, in order to allow switching between the two copies with the least loss of information. For this purpose, in the known examples, an appropriate subroutine reads the data in the previously active data RAM and recopies it into the data RAM now active. Of course this involves a loss of real processing time. This shortcoming is also especially serious just because it appears at a critical moment for operation of the equipment.

From all the above considerations, the operational limitations and shortcomings, which the above units of known type still display, are evident.

Accordingly the purpose of the present invention is to provide a duplicate control and processing unit for telecommunications equipment also wholly or partly duplicated which would solve the aforesaid shortcomings.

SUMMARY OF THE INVENTION

To achieve said purposes the object of the present invention is a duplicate control and processing unit for telecommunications equipment consisting of two identical control units appropriately connected to each other and to the rest of the equipment. Each control unit comprises: a processing unit capable of performing all the processing necessary for operation and control of the entire set of equipment, including the function of determining if said processing unit must be considered active or on standby; a data By containing the data necessary for operation of the equipment and those

3 processed during operation thereof; and some circuits peripheral to the processing unit including respective interfaces between the processing unit and the remaining circuits and devices of the equipment.

The data RAMs and the peripheral circuits of both the control units include respective double gate access circuits to which arrive the busses of both the processing units. Said circuits include a selector appropriately commanded in case of failure, which prevents the processing unit put out-of-service from acceding to the rest of the equipment and allows access to the formerly standby copy.

The active processing unit performs the writing cycles in data RAM synchronously in both the duplicate data RAMs, thus allowing immediate recovery of the data necessary for continuation of operation after a switch between the two processing units following a failure, as better described in claim 1.

Another object of the present invention is a variant of the duplicate control unit which is the object of the present invention, wherein the active processing unit performs both the writing and reading cycles synchronously in both the duplicate data Pats. In addition, both the words read synchronously are compared and, in case of difference, generate an alarm signal toward the microprocessor which can thus start the necessary maintenance operations.

The control unit in accordance with the variant allows another saving of real time because it simplifies considerably periodic verification of the identity of the contents of the duplicate data RAMs, a verification which is absolutely essential immediately after switching of one processing unit to the other, following a failure.

A duplicate control unit provided in accordance with this variant is better described in claim 6.

In view of the foregoing, the advantages of a duplicate control unit provided in accordance with the present invention and its variant are clear. A first advantage is that it is particularly reliable in case of failure of any one of its parts because it can be quickly reconfigured in all its parts. More precisely, the active processing unit can access without distinction a peripheral block of its own control unit or its duplicate homologue. A second advantage is that of allowing considerable savings in real processing time, especially after a switch between the processing units, thanks to the synchronism of the writing and reading operations in the two copies of the duplicate data RAMs.

Additional purposes and advantages of the present invention are clarified in the following detailed description of an embodiment thereof and the annexed drawings given by way of nonlimiting example.

4

DESCRIPTION OF THE PREFERRED EMBODIMENT

Figure 1:
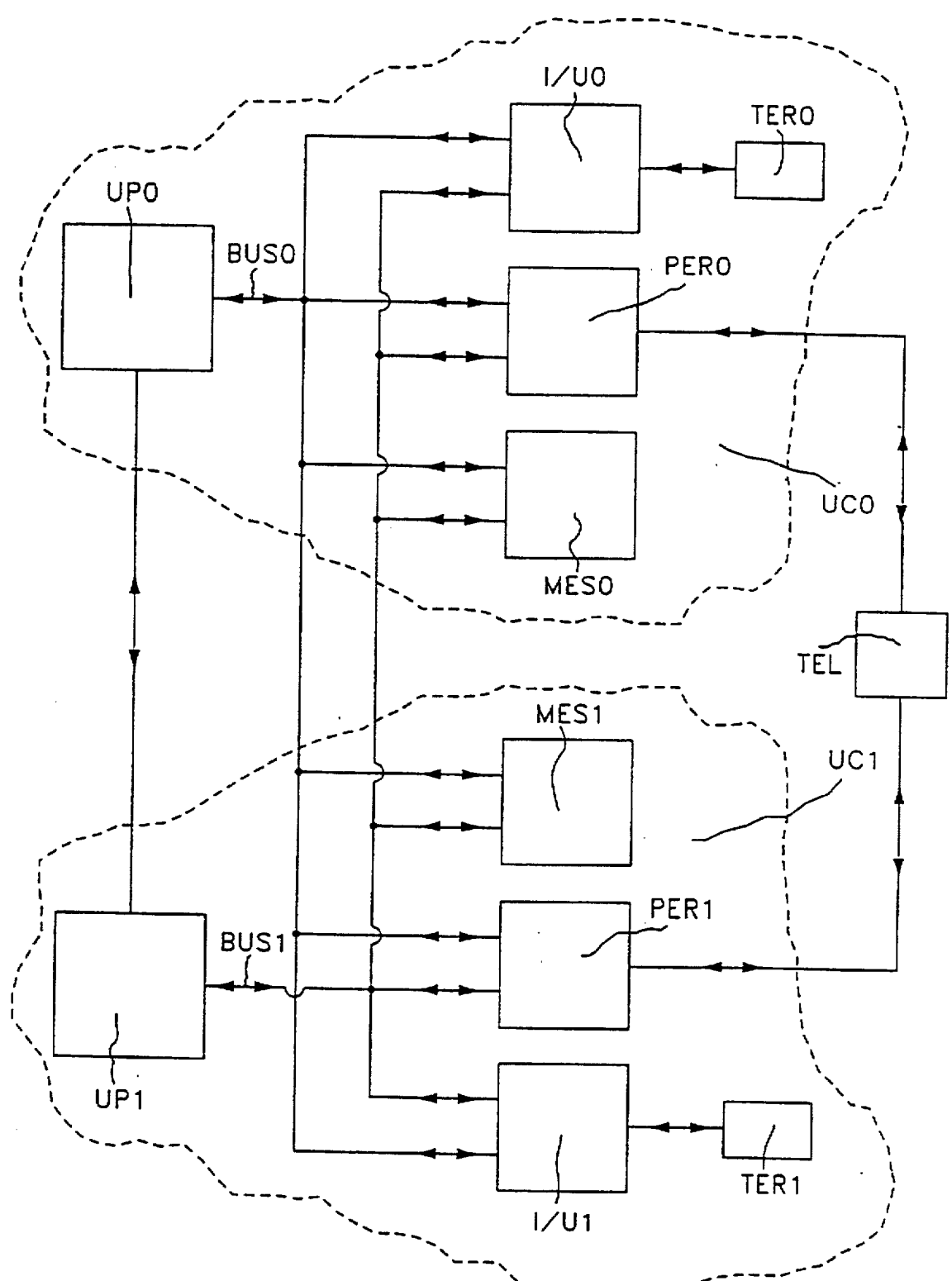
FIG. 1 shows a very general block diagram of telecommunications equipment, comprising a duplicate control unit in accordance with the present invention, consisting of two identical control units indicated by UC0 and UC1 appropriately interconnected to each other and to a block TEL which indicates the rest of the equipment.

With reference to FIG. 1, UC0 and UC1 indicate two control units which together constitute a single duplicate control unit for telecommunications equipment which includes in addition to the UC0 and UC1 units the block TEL. The control unit UC0, also termed copy 0, consists of the blocks UP0, PER0, MES0, I/U0 and TER0. Similarly the control unit UC1, also termed copy 1, consists of blocks UP1, PER1, MES1, I/U1 and TER1.

The blocks UP0 and UP1 represent processing units, each capable of supervising operation of the entire set of equipment. The blocks MES0 and MES1 include RAM banks in which are memorized the data processed during normal operation of a processing unit, and the related access and interface circuits. The PER0 and PER1 blocks schematise units considered peripheral in relation to the two processing units. Said blocks are also part of the duplicate control unit because they are essential for allowing the processors to perform their supervision on the rest of the equipment. More precisely the blocks PER0 and PER1 can represent either mass memories and related access and interface circuits towards the processing unit or the interfaces between the processing units and the rest of the equipment not belonging to the control unit, as for example the block TEL.

The blocks I/U0 and I/U1 together with the respective blocks TER0 and TER1 also constitute peripheral circuits. More precisely, the blocks TER0 and TER1 represent either general purpose input/output terminals, as for example personal computers or alarm warning light panels, or remote operation relays or other. The blocks I/U0 and I/U1 include circuits for access and interface towards the processing units and circuits for extension of the bus of the active processor towards the respective blocks TER0 or TER1.

Each of the processing units UP0 and UP1 possess its own two-way bus indicated by BUS0 and BUS1 respectively. Each of the two busses is connected to the blocks UP0, PER0, MES0, I/U0 of the control unit UC0 and in parallel to the blocks UP1, PER1, MES1 an I/U1 of the control unit UC1. The processing units UP0 and UP1 are also connected to each other by a special two-way connection as explained below. The peripheral unit represented by the block PER0 is connected in two-way manner to the block TEL, which schematises a group of general purpose devices characteristic of the type of equipment supervised by the duplicate control unit, e.g. telephones in the present case. Similarly, the block PER1 is also connected in two-way manner to the same block TEL.

Figure 2:
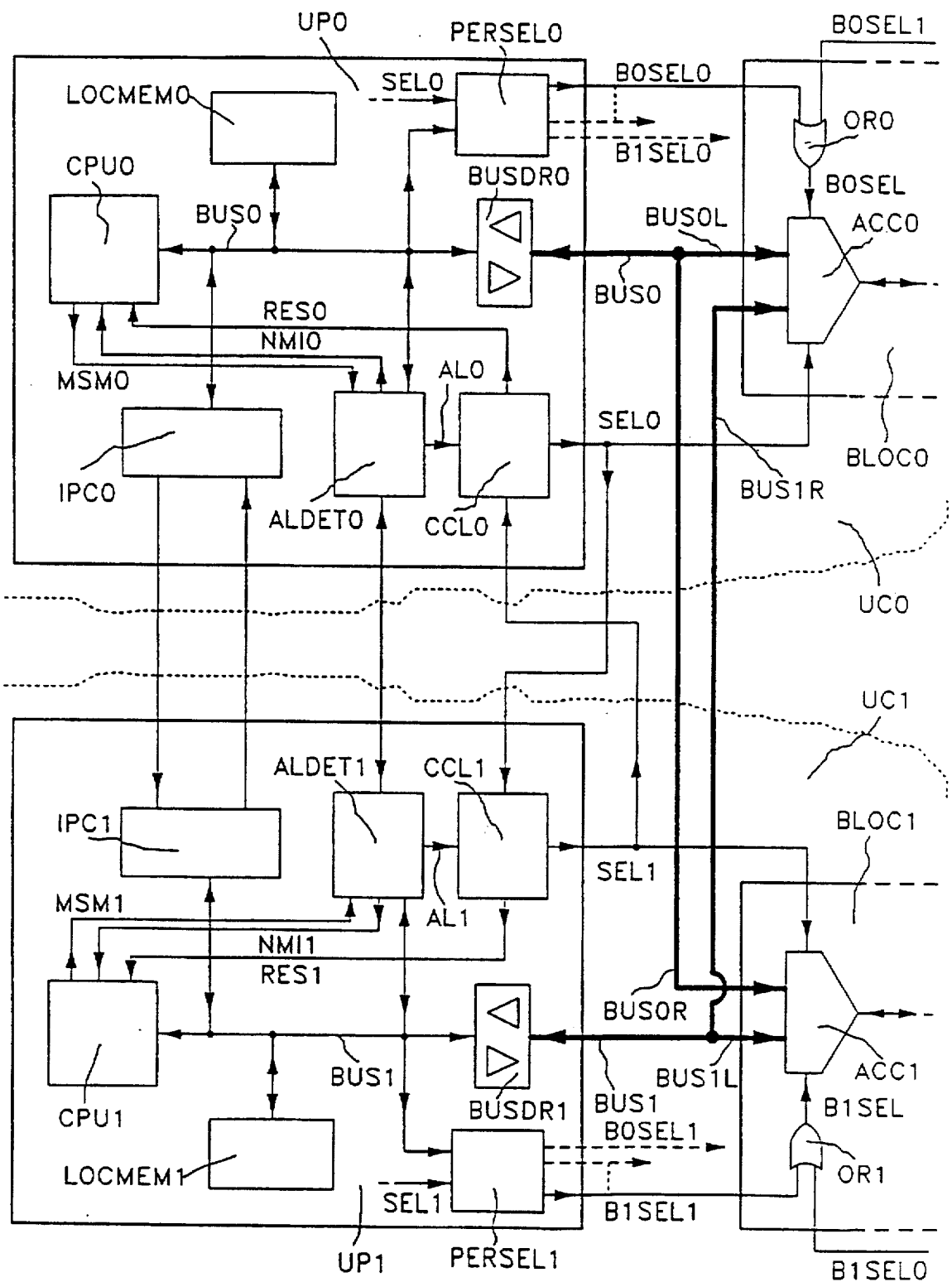
FIG. 2 shows in greater detail the block diagram of the duplicate control unit of FIG. 1, making clear the blocks indicated above by UP0 and UP1, their mutual interconnections and those existing between said blocks and the remaining blocks belonging to the control units UC0 and UC1.

With reference to FIG. 2 in which the same elements of FIG. 1 are indicated by the same symbols, there are seen the processing units UP0 and UP1 both connected to two blocks indicated by BLOC0 and BLOC1 which represent respectively any one of the blocks MES0, PER0, I/U0 and MES1, PER1, I/U1.

The block UP0 in turn consists of the blocks CPU0, LOCMEM0, PERSEL0, BUSDR0, IPC0, ALDET0 and CCL0. Similarly the block UP1 consists of the blocks CPU1, LOCMEM1, PERSEL1, BUSDR1, IPC1, ALDET1 and CCL1 which are similar in all respect to the corresponding blocks of UP0. In the blocks BLOC0 and BLOC1 can be seen two respective logical gates of OR indicated by OR0 and OR1 and two respective access circuits with double gate indicated by ACC0 and ACC1.

The bus BUS0 is a parallel asynchronous bus on which transit the signals representing data and addresses, not multiplexed together, with which are associated the necessary control signals of the read/write and ready types, interrupts from the peripheral blocks, etc., and some state signals characteristic of the type of processor used. Verification of the integrity of BUS0 is done by associating with each informative byte, whether data or addresses, a respective parity bit.

In FIG. 2 the bus BUS0 is indicated as two-way, but in reality only the signals representative of the data are two-way, while the direction of the address, control and state signals is always from the processor towards the peripheral circuits, excluding ready and interrupt signals from the peripheral blocks, which take the opposite direction.

The bus BUS0 coming from the block CPU0 is connected to the blocks LOCMEM0, PERSEL0, IPC0, ALDET0 and to the block BUSDR0 which represents a two-way bus-driver of known type, including transceivers. Before extension toward the peripheral blocks, the BUS0 block is split in two identical busses indicated by BUS0L and BUS0R. The busses BUS0L and BUS0R are connected to first gates of the access circuits ACC0 and ACC1 respectively to allow access to the blocks BLOC0 and BLOC1 by UP0.

Similarly, the bus BUS1 from the block CPU1 is connected to the blocks LOCMEM1, PERSEL1, IPC1, ALDET1 and to the block BUSDR1 which represents a two-way bus-driver of known type. Before extension toward the peripheral blocks, the bus BUS1 is split in two identical busses indicated by BUS1L and BUS1R. The busses BUSLL AND BUSLR are connected respectively to second gates of the access circuits ACC1 and ACC0 to allow access to the blocks BLOC1 and BLOC0 by UP1.

For the sake of simplicity the following remarks apply only to the blocks belonging to the processing unit UP0. It is understood that the same remarks also apply to the blocks belonging to the processing unit UP1 because the units UP0 and UP1 are identical.

Figure 3:
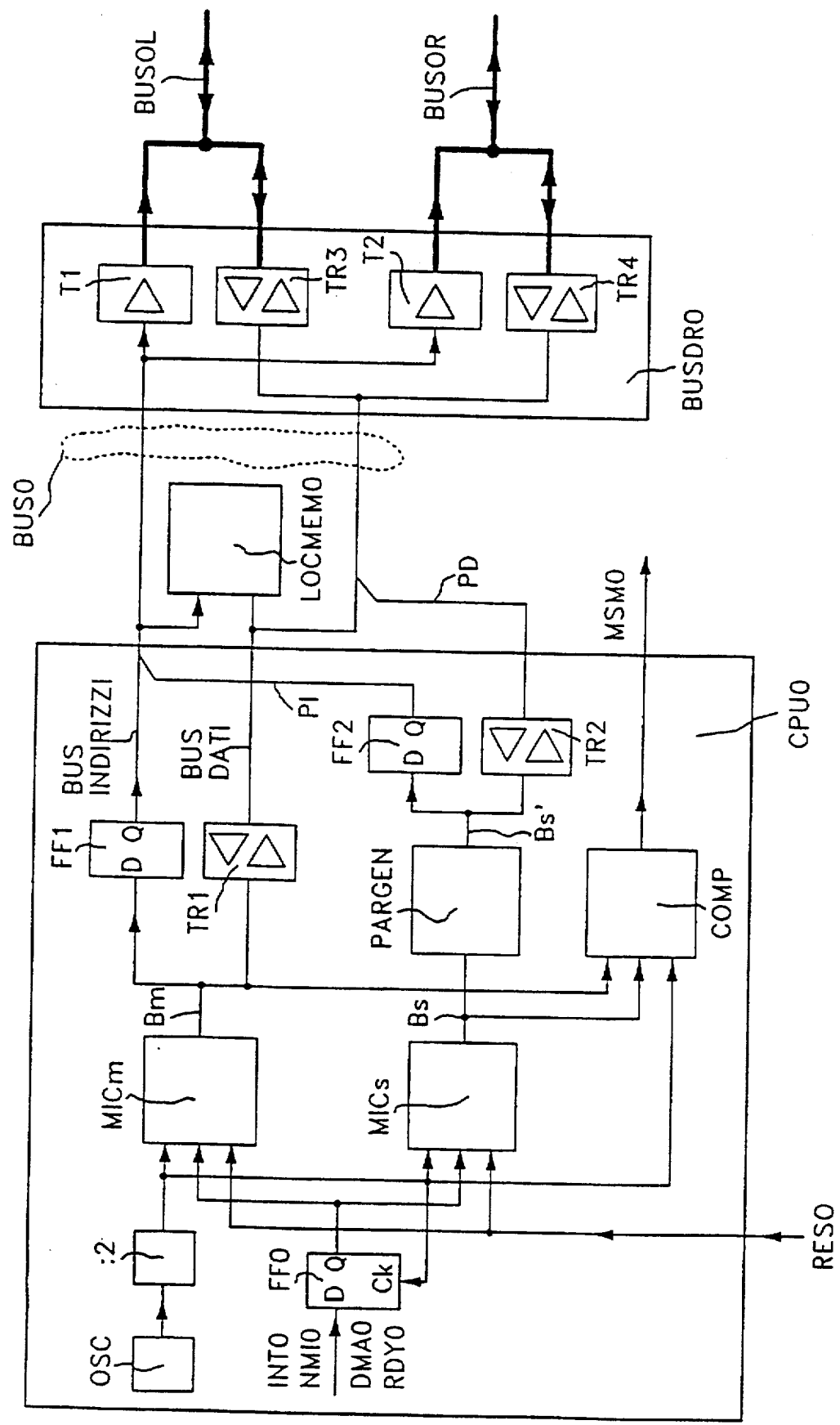
FIG. 3 shows the circuitry diagram of a block belonging to UP0 and indicated by CPU0 in FIG. 2.

The block CPU0 represents a microprocessor circuit which is discussed more thoroughly together with FIG. 3. To two inputs of the block CPU0 arrive an unmaskable interrupt signal coming from the block ALDET0 and a reset signal RES0 coming from the block CCL0 respectively. At one output of said block there can be an alarm signal MSM0 directed toward the block ALDET0.

The block LOCMEM0 includes substantially an EPROM and a RAM. In the EPROM are memorized the self-diagnosis and bootstrap programmes of the UP0 unit. In the RAM is memorized the actual software programme for operation of the processing unit UP0 and the local data which are not necessary for the processing unit UP1 when it becomes active.

The block PERSEL0 includes the decoding logical circuits for the information on BUS0 which, for each read or write access made by CPU0 to the peripheral blocks, generate an appropriate combination of signals BOSEL0, B1SEL0, etc. sent to the blocks BLOC0, BLOC1, etc. for selective enabling thereof. At an enabling input of PERSEL0 arrives a copy selection signal SEL0 from the block CCL0. The block PERSEL0 includes also a synchronous duplication circuit for the write cycles in peripheral data memory (not shown in the figures) whose operation is explained below.

The block ALDET0 allows maintenance of the processing unit UP0 and for this purpose includes special detection circuits for failures occurring in the block UP0 and generation of the corresponding alarms. Said circuits are implemented by means of normal decoding logical circuits and are readily accessible to those skilled in the art and therefore not shown in the figures. The block ALDET0 is connected to BUS0 and to the corresponding block ALDET1 of UP1 by means of a two-way connection different from BUS0. Said connections allow the block ALDET0 to acquire knowledge of all the alarms detected in the entire duplicate control unit. In case of detection or acquisition of one or more alarms, the block ALDET0 generates the unmaskable interrupt signal NMI0 sent to the block CPU0. The block ALDET0 is also connected to the block CCL0 by means of a one-way connection path indicated by AL0.

Figure 4:
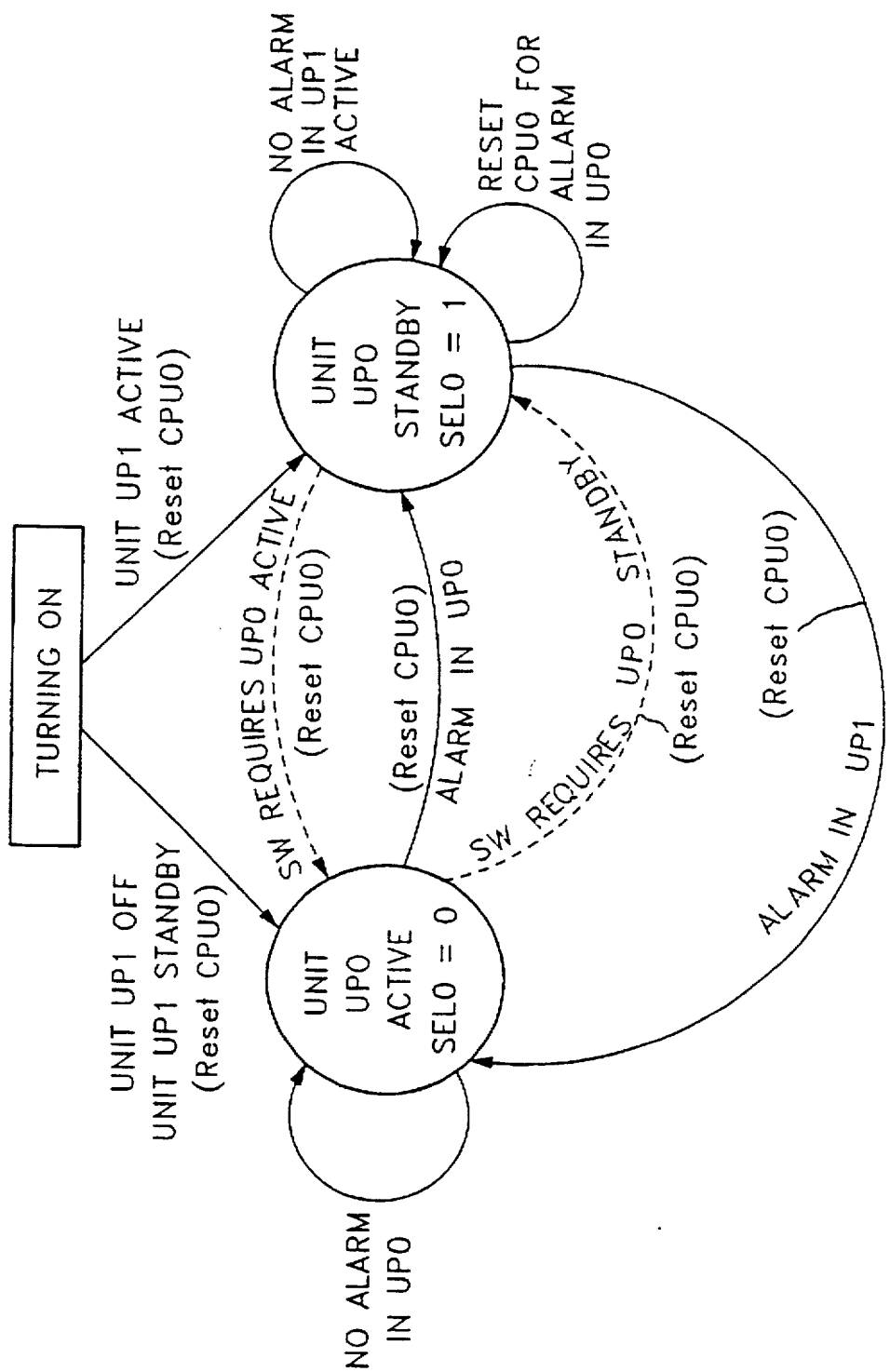
FIG. 4 indicates a diagram of the sequential logical states which shows the operation of a configuration control circuit indicated by CCL0 in FIG. 2.

The block CCL0 includes a copy selection EPROM containing a firmware which allows it to operate like an asynchronous sequential logical circuit for determination of the active copy UP0 or UP1, as seen better with the explanation of FIG. 4. Said block also includes an oscillator which generates a local clock signal independent of the one generated in the block CPU0, and a counter which produces a 16 ms timing used to filter some alarm signals coming from ALDET0.

To the block CCL0 arrive a copy selection signal SELL generated by the block CCL1 and, through the connection AL0, some signals which are described below. The block CCL0, for the purpose of selecting the active processing unit, generates the copy selection signal SEL0 which it sends to a selection input of the double gate access circuit ACC0 and to an input of the block CCL1. The signal SEL0 is also sent to the block PERSEL0. Under certain conditions which are clarified in the examination of FIG. 4, the block CCL0 generates a reset signal RES0 which it sends to the block CPU0.

The processing unit UP0 is directly connected to the processing unit UP1 and vice versa by means of an especially dedicated synchronous communication channel. The circuits necessary for implementation of said channel are included in the blocks IPC0 and IPC1. Additional details on the constitution of the block IPC0 are not necessary because implementation of a synchronous communication channel is known to those skilled in the art.

As regards the other blocks of the duplicate control unit of FIG. 2 different from UP0 and UP1, it is useful to recall that, as mentioned above, the blocks BLOC0 and BLOC1 schematise respectively any one of the peripheral blocks MES0, PER0, I/U0 and MES1, PER1, I/U1. Said schematising concerns essentially only the double gate access circuits and those for interface toward the two processing units UP0 and UP1 and some circuits which control the correct operation of said peripheral blocks.

For the sake of simplicity, hereinafter only the block BLOC0 is explained, it being understood that the same remarks apply to the block BLOC1.

The block BLOC0 includes the logical gate of OR with two inputs OR0 to which arrive respectively the enabling signal BOSEL0 and a similar enabling signal BOSEL1 coming from the block PERSEL1. At the output of OR0 is an enabling signal BOSEL directed toward the double gate access circuit ACC0. The latter allows selective access to one or the other of the two processing units UP0 and UP1. For this purpose, ACC0 includes two-way two-input selectors (not shown in the FIGS.) to which arrive BUS0L and BUS1R respectively. The output of the selectors is connected to transceivers (included in ACC0 and also not shown in the FIGS.) which allow extension of the bus of the active processing unit in the BLOC0. At the selector selection input arrives the copy selection signal generated by the block CCL0. At the enablement input of the transceivers included in the block ACC0 arrives the enablement signal BOSEL.

The block BLOC0 also includes a control circuit which performs some important operations specified below for control of the integrity of said block. In case of significant failure of one or more circuits of BLOC0, the control circuit generates an interrupt towards the active processor. Said control circuit of BLOC0 is provided by the use of normal logical circuits and is readily implemented by those skilled in the art and therefore not illustrated in the FIGS.

With reference to FIG. 3 in which all the elements common to FIGS. 1 and 2 are indicated by the same symbols, there can be seen the blocks CPU0 and BUSDR0 shown in greater detail. The block CPU0 consists substantially of the blocks OSC, :2, MICm and MICs, PARGEN, COMP, FF0, FF1, FF2, TR1 and TR2. The block BUSDR0 includes the blocks T1, T2, TR3 and TR4. In the FIG. can also be seen the block LOCMEM0.

The block OSC represents a local oscillator of great stability which supplies the clock signal to the processing unit UP0. The block :2 is a simple frequency divider which divides by two the clock signal generated by OSC before it reaches a respective timing input of the blocks MICm, MICs, FF0 and COMP. The blocks MICm and MICs include two identical INTEL 80C186 microprocessors and respective VLSIs which assist their operation.

The block FF0 represents an assembly of flip-flops to whose inputs arrive the unmaskable interrupt signal NMI0, some maskable interrupt signals INT0, some signals DMA0 for direct access to the memory block LOCMEM0, and a ready signal DRY0 sent by the peripheral blocks. Said signals are synchronised by the block FF0 and sent to respective inputs of MICM and MICs. To the latter also arrives the signal RES0.

The block COMP represents a circuit which controls correct operation of the microprocessors MICm, MICs and that of the local oscillator, generating in case of failure the internal alarm signal MSM0. For this purpose the two busses of the microprocessors MICm and MICs indicated by Bm and Bs respectively reach the inputs of COMP.

The data and address lines of the bus Bs alone reach the input of the block PARGEN which represents a parity bit generator whose output is a bus BS' different from Bs only in that it has additional lines for the data and address parity bits.

The address lines of the busses Bm and Bs' are connected to the inputs of the blocks FF1 and FF2 respectively which represent registers which memorise said addresses during a read or write access cycle. The data lines of the busses Bm and Bs' are connected to a first end of the blocks TR1 and TR2 respectively which represent common transceivers. At the outputs of the blocks FF1 and FF2 the address lines are connected in parallel to each other to form single address lines of the bus BUS0, including the lines of parity bits in Bs'. Similarly, the lines of data at a second end of the transceivers TR1 and TR2 are connected in parallel to each other to form unique data lines of the bus BUS0 which include the parity bit lines in Bs'. For the sake of simplicity, in the representation for BUS0, the lines for the control and state signals of the microprocessors are not shown but are present.

The address lines of BUS0 are connected to the input of the blocks T1 and T2 which represent a set of drivers related to the busses BUS0L and BUS0R. The data lines of BUS0 are connected to the input of the blocks TR3 and TR4 which represent a set of transceivers for said busses BUS0L and BUS0R. The control and state signals on the bus Bm determine the correct direction of the transceivers TR1, TR2, TR3 and TR4 in conformity with the type of read or write access performed by CPU0.

In the operation of the duplicate control unit of the example with reference to the FIGS. 1, 2 and 3 each of the two control units UC0 and UC1 can be configured either as active or standby copy. Choice of the configuration is substantially made by the blocks CCL0 and CCL1.

The active processing unit controls all the other blocks of the equipment including those belonging to the standby control unit copy, while access by the standby processing unit to any peripheral block is prevented. This is possible because, as may be seen in FIG. 1, even if the control units UC0 and UC1 are indicated as two distinct units, in reality the interconnections of the peripheral blocks to both the processing units configure UC0 and UC1 as a unique control unit, made up of individual blocks all duplicated and selectively accessible to the processing unit active at that time.

This circuitry structure makes the duplicate unit extremely reliable because, in case of failure of any part, said part can be promptly replaced without having to switch the entire individual control unit as in the previous art.

The remaining blocks of the equipment connected to the duplicate control unit can in turn be duplicated or not. In FIG. 1 only the block TEL is not duplicated. Otherwise it would be necessary to equip another pair of peripheral units of the PER0/PER1 type as interface toward the duplicate block.

As regards the block CPU0, the two INTEL 80C186 microprocessors included therein work in microsynchronised mode and constitute the heart of the processing unit UP0. To guarantee the microsynchronising, the paths of the clock signal from the oscillator OSC to the two microprocessors have the same length. In addition, an appropriate circuit inside the block COMP, verifies continuously the existence of the clock signal. In addition all the control signals applied to the inputs of the two microprocessors, except RES0, are first resynchronised with said clock signal.

Correct microsynchronisation of the two microprocessors is controlled by the block COMP which includes circuits which verify instant by instant the identity of addresses, data and control signals generated by the two devices, a difference being interpreted as a failure. The block COMP also includes a watchdog timer, to detect infinite-loop condition.

The different failure signals are placed in OR inside COMP to generate the signal MSM0 which represents the internal alarm of the block CPU0 which is sent to the block ALDET0 and thence made to continue toward the blocks CCL0 and ALDET1.

As regards the block LOCMEM0, the RAMs and EPROMs included therein have a dimension such as to allow memorisation of an additional parity signal for every eight words memorized. Said memories are also protected by another redundancy code which allows verification of the integrity of their contents. This redundancy code is generated to protect the integrity of every 64 kbytes of code or data.

As regards operation of the block ALDET0 it is useful to point out that it allows the processing unit UP0 to carry out maintenance operations on the entire set of equipment. For this purpose the principal failure detection circuits included in the block ALDET0, not shown in the figures because readily implemented by those skilled in the art, are:

a detector circuit for parity errors in read operations performed by addressing the memories included in the block LOCMEM0, or addressing any peripheral block BLOC0 or BLOCL;

a detector circuit of absence of ready signal RDY0 normally sent toward the active processing unit by the addressed peripheral block;

an OR circuit for all the alarms detected by the block ALDET0, or which reach it, and whose output is the unmaskable interrupt signal NMI0 directed towards the microprocessor circuit CPU0;

appropriate trap circuits which in case of alarm memorise in a special trap register the bit configuration on BUS0, in order to identify the type of operation which was in progress when the alarm occurred. In addition the detail of the alarms detected by ALDET0 is memorized in the trap register.

To the various circuits of the block ALDET0, arrives all the information on failures or access errors which have given rise to an alarm condition in one or more blocks of the entire duplicate unit and in the remaining blocks of the equipment (TEL). Said information arrives in the following manners: by means of the signal MSM0, in case of failure of the processor circuit CPU0; by decoding of the data on BUS0 made in concomitance with reception of an interrupt signal; and finally through two-way connection with the block ALDET1, in case of failure of a block of the unit UP1.

In the presence of particular failures of a peripheral block, it could happen that the processing unit UP0 stops while waiting for an event which never occurs, but detection of the ready signal RDY0 allows the processor to obviate this serious shortcoming. After detection of one or more alarms, the block ALDET0 generates the unmaskable interrupt signal NMI0 which it sends to the processor circuit CPU0. The latter acquires the detail on the type of alarm by reading the related information from the trap registers of ALDET0 or directly from the data of BUS0.

As regards operation of the configuration control block CCL0, it is useful to specify that the signals coming from the block ALDET0 through the connection AL0 are:

the signals MSM0 and MSM1 which represent the alarms for internal failure of the respective processor circuits CPU0 and CPU1;

an alarm signal for failure of the power supply of the processing unit UP1;

two bits coming from the data transiting on BUS0 which represent in codified form the requests of the software concerning the operating state, active or standby, wanted for UP0, and a signal called 'power-up reset' generated upon turning on the power supply belonging to the processing unit UP1 and used for initialization of the internal logical of the block CCL0.

The block CCL0 analyses all of said signals and determines if its own processing unit UP0 should be active or standby, generating for this purpose the signal SEL0 which is distributed only to the peripheral blocks of UC0 to control the choice of the active copy of the unit processor UP0 or UP1. One function of the block CCL0 is to filter possible disturbances on the input signals by making use of an appropriate timing taken from the clock signal inside the block. The main purpose of said filtering is to allow passage of 16 ms of time before the firmware memorized in the copy selection EPROM can react to an alarm coming from the CPU0. During this time the software seeks to cancel the alarm.

The copy selection EPROM belonging to CCL0 simulates, as already mentioned, an asynchronous sequential logical circuit. For this purpose, on the address bus of the EPROM arrive the signals which enter the block CCL0. The words contained in the EPROM, read in correspondence with predetermined configurations of the address bits, represent the signals output from the block CCL0. As known, it is good design practice to completely and appropriately fill the EPROM even for those address bit configurations which do not correspond to any well defined logical state of operation of the duplicate unit. This is because, especially during transitions of the signals on the address lines, transitory readings of any word of the EPROM are theoretically possible. It is absolutely necessary that said words read transitorily do not generate output signals of CCL0 which might modify the pre-existing configuration.

For a detailed explanation of the operation of the copy selection firmware please see the illustration of the diagram of the sequential logical states of FIG. 4. It should be recalled at this point that the decision made by the block CCL0 is made operative through the signal SEL0 sent exclusively to the peripheral blocks of the BLOC0 type belonging to the control unit UC0. In dual mode, the decision of the block CCL1 is made operative by sending the signal SEL1 only to the peripheral blocks belonging to the control unit UC1. This allows holding physically separate from each other the two copies of the duplicate control unit, increasing the reliability of the equipment. The logical values of the signals SEL0 and SEL1 must be congruent to allow access by the active processing unit to the peripheral blocks of both the control units.

As regards the block PERSEL0, it must be specified that the synchronous duplication circuit for the write cycles in peripheral data memory consists essentially of the aforementioned decoding logical circuits for the information on BUS0 and an auxiliary register in which CPU0 writes a two-bit control configuration which is set forth below together with its meaning:

"00 11": to perform a write cycle in both the peripheral data memories MES0 and MES1 and a read cycle only in the memory MES0;

"01": to perform a read and write cycle only in the peripheral data memory MES0;

"10": to perform a read and write cycle only in the peripheral data memory MES1;

"11": to perform a write cycle in both the peripheral data memories MES0 and MES1 and a read cycle only in the memory MES1.

The aforesaid decoding logical circuits decode the contents of the auxiliary register together with the signals on BUS0, generating each time the appropriate combinations of signals of the BOSEL0 and B1SEL0 type for enablement of the preselected peripheral circuits also including the memories MES0 and/or MES1. More specifically, if the auxiliary register contains the configurations 00 or 11, the block PERSEL0 generates in write a pair of enablement signals for both the memories MES0 and MES1. If the access concerns peripheral circuits different from MES0 and/or $MES_1$, the contents of the auxiliary register are not taken into consideration.

The decoding operations of PERSEL0 are enabled by the active copy selection signal SEL0 to avoid that, when the processing unit UP0 is in standby, it continues to control the access circuits ACC0, ACC1 of the peripherals BLOC0 and/or BLOC1.

From all of the above remarks on the copy selection signals, it can be inferred that generation of the SEL0 and SEL1 signals allows unequivocal definition of the roles of the two processing units. More precisely, the processing unit on standby remains there until, because of failure of the active copy, it is called upon to replace the one that was active. Such a choice, which could be at first sight uneconomical because it leaves a resource normally unused, allows in reality effective and reliable control of the entire set of equipment by a single processing unit.

As regards the two-way communication channel between the blocks IPC0 and IPC1, it is used by the active processing unit during performance of some activities which it carries out on the standby unit. It is used for example in supervision processes for the transfer of some programmes and to activate failure diagnosis processes. The communication channel uses a protocol HDLC because it is particularly efficient in protecting the information transferred between the two control units UC0 and UC1.

As regards operation of the blocks BLOC0 and BLOC1 which schematise the peripheral blocks I/U0, PER0, MES0 and I/U1, PER1, MES1, it is useful to recall that they include circuits for access and interface towards both the processing units UP0 and UP1 and control and maintenance circuits for said peripheral blocks.

As may be seen in FIG. 2, each block of type BLOC0 and BLOC1 is connected to the two processing units by two different physically separate access paths, a first path being represented by the busses BUS0L and BUS0R and a second path by the busses BUS1R and BUS1L. In this manner events of any type, even transitory, which appear any place in the equipment have very little chance of influencing simultaneously both of said access paths and consequently said events could with the greatest difficulty put the blocks BLOC0 and/or BLOC1 completely out of use paralysing the entire set of equipment.

For the sake of simplicity the following remarks apply only to the block BLOC0 but could apply by analogy also to the block BLOC1 given the equivalence of the two blocks.

As stated above, the copy selection signal SEL0 selects the signals coming from one or the other processing unit and the selected bus can be extended to the inside of BLOC0 only when the selection signal BOSEL is active, i.e. when one of the two signals BOSEL0 or BOSEL1 is generated by the processing unit active at that time, to accede to said peripheral block. In this case BOSEL together with the control and state signals on the selected bus enables the right direction of the transceivers of ACC0 compatibly with the type of read or write access.

As regards the control circuit included in BLOC0, the main operations which it performs for checking of the integrity of the peripheral block are the following:

- checking of the correct parity of the address bits during the read or write operations, while in case of a parity error the write signal is inhibited to avoid unforeseeable operations,
- checking of the correct parity of the data bits after write operations, and
- checking of the consistency of the control signals sent by the processing unit and the related state signals which indicate the type of access which the processor wants to perform.

In case of significant failure of one or more BLOC0 circuits, the internal control circuit generates an interrupt towards the active processor and the information about the type of failure is placed in a register of BLOC0 to be subsequently read by the active processor.

As regards the specific operation of the individual peripheral blocks of FIG. 1, it is necessary to specify that the blocks I/U0, MES0 and PER0 are identical with the blocks I/U1, MES1 and PER1 and therefore a single description can be given for all of them.

The blocks MES0 and MES1 include a respective RAM bank in which are memorised the basic data, i.e. all the information which allows the active processing unit to control all the functions of the equipment. Said information includes for example data on the configuration of the system and the intermediate data of some processing.

If operation is normal, i.e. with the blocks MES0 and MES1 both unimpaired, with the processing unit UP0 is associated the block MES0 and with the unit UP1 is associated MES1. Assuming that the unit UP0 is active, the microprocessor of UP0 reads whatever is needed from MES0 and writes in MES0 and MES1 synchronously. In case of switching for failure of UP0, the replacing processing unit reads from MES1 and writes in MES1 and MES0 synchronously. This mode of operation allows considerable saving of real time for the active processing unit, especially in the period immediately following its activation. Indeed, the processor just activated finds already in its peripheral data memory bank the update data necessary for continuation of its activity.

The peripheral blocks I/U0 and I/U1 include identical interface circuits toward the respective blocks TER0 and TER1. The latter can represent either general purpose input/output terminals, as for example personal computers, or indicator, or warning lamp panels, or remote operation relays or other. In any case, depending on the type of equipment or device represented by TER0 and TER1, provision of said interface circuits is possible for those skilled in the art and therefore requires no further explanation.

The peripheral blocks PER0 and PER1 include identical interface circuits towards the block TEL which represents in a nonlimiting manner a number of telephone sets. Said interface circuits are already known to those skilled in the art and therefore are not shown.

With reference to FIG. 4, there is illustrated the diagram of the main sequential logical states for the firmware memorized in the copy selection EPROM included in the block CCL0. It is possible to obtain an analogous diagram for the copy selection firmware included in the block CCL1, by replacing in FIG. 4 the terms UP0, CPU0, SEL0 with UP1, CPU1, SEL1. The diagram is not further burdened with the introduction of logical states corresponding to incongruent configurations which are however possible only during very brief transients, as for example the configurations in which both the processing units UP0 and UP1 are active or standby. The firmware of course allows for occurrence of said situations and provides therefor.

The logical states shown in the diagram are substantially three, i.e. turning on, UP0 unit active, UP0 unit on standby. The signal SEL0 has logical value 0 for UP0 active and 1 for UP0 on standby. Starting from the turning on state, the next following state is that of UP0 unit active, if the conditions of unit UP1 turned off or on standby occur. The next state after turning on is that of the unit UP0 on standby if the unit UP1 is active. In all cases, before passing from the turning on state to the two following states, the firmware generates the reset signal RES0 of the processor circuit CPU0. Let it be assumed that the next state is that of active UP0. In this case if there is no alarm in the unit UP0, said unit remains indefinitely in this state of activity. But if an alarm is detected in the unit UP0, it passes into the state in which it is in standby after resetting of CPU0.

The unit UP0 remains indefinitely in the standby state if no alarm occurs in the active unit UP1. Upon occurrence of an alarm in UP1, the unit UP0 returns to active state after reset of CPU0. With the unit UP0 on standby, no alarm in active UP1 and detection of alarm in UP0 on standby, the unit UP0 remains on standby but the firmware generates a reset signal for the processor circuit CPU0.

If there is no alarm in either of the units UP0 and UP1, the software resident in the processing unit UP0 can require the firmware of CCL0 to switch the unit UP0 from active to standby or vice versa after reset of CPU0 in either case. Said request is made through the aforementioned two state bits made to reach the address line of the copy selection EPROM.

The duplicate control unit described in the nonlimiting example duplicates the information in the write phase, but does not verify data alignment in the two copies of the peripheral data memories. It should be specified that by data alignment is intended the perfect matching of the contents of the two memories. Said verification becomes absolutely essential immediately after the switching of a processing unit from standby to active copy. The verification is necessarily the responsibility of an appropriate subprogram which verifies the identity of the contents of the two memories. Therefore the type of implementation of the example does not relieve the software completely of all the activities connected with duplication of the information. Said implementation is the fruit of a compromise between the requirement to save real processing time and that of not excessively complicating the hardware of the duplicate control unit.

There is therefore described with reference to FIG. 2 and the above description a variant of the duplicate control unit which is the object of the present invention consisting of modifying appropriately the synchronous duplication circuit of the cycles of writing in peripheral data memory included in the blocks PERSEL0 and PERSEL1, so that every time the active processing unit performs a reading access in its own peripheral data REM, the same type of access is also performed synchronously in the other copy of the same peripheral memory. The words read are also compared with each other and in case of difference there is generated an alarm signal sent through the blocks ALDET0 or ALD3T1 to the respective processor circuit which can thus start the necessary maintenance operations.

A synchronous duplication circuit appropriately modified to provide the variant in question differs from chat described in the nonlimiting example mainly in some slight modifications made in the decoding logical circuits included in the blocks PERSEL0 and PERSEL1 and by the addition of a comparator for the words read.

More precisely, said modified decoding circuits detect a condition of read access to its own peripheral data RAM by the active processing unit, and generate therefor a pair of signals BOSEL0, BISEL0 which enable both the data memories MES0 and MES1. Said modifications are known to those skilled in the art and therefore no further details thereon are necessary.

A duplicate control unit realised in accordance with the variant in question allows another saving of real time of the active processor. Indeed, it is no longer necessary to verify data alignment in the two peripheral data memories MES0 and MES1 by the software after each switch between the two processing units due to a failure.

From the description given and the information on the particular microprocessor used and which can be readily found in the literature supplied by the maker thereof, those skilled in the art are enabled to provide both the hardware and the software for the duplicate control unit which is the object of the present invention.

We claim:

1. In a duplicate control and processing unit for telecommunications equipment having peripheral devices controlled by the duplicate control and processing unit, wherein the duplicate control and processing unit consists essentially of two identical control units connected to the peripheral devices, wherein each control and processing unit includes a processing unit with a processing unit bus and the processing unit carries out processing necessary for operating and controlling the telecommunications equipment, and wherein a plurality of peripheral circuits are connected to the processing unit bus for assisting the processing unit in carrying out its control functions, the improvement which comprises:

each processing unit including a configuration control circuit generating a respective copy selection signal directed to the peripheral circuits belonging to the control units assigned thereto, the copy selection signals having logical values selectively determining which of the processing units is an active processing unit taking control of the telecommunications equipment;

each processing unit further including a clock signal generator, two mutually microsynchronized microprocessors connected in parallel to a single bus including lines for parity control and a RAM containing control software, and the peripheral circuits comprising respective interface circuits towards said processing unit and other telecommunications equipment not belonging to the duplicate control unit each peripheral circuit including a double gate access circuit having gates connected to said busses of said processing units, and said access circuit having a control input receiving the copy selection signal for electrically connecting the bus lines of the respectively active processing unit and electrically disconnecting the bus lines of the respective processing unit on standby;

the peripheral circuits being duplicated, and a duplicate RAM of the duplicated peripheral circuits being adapted to contain the data necessary at the active processing unit for operating the telecommunications equipment and the data processed during an operation thereof, and comprising a mass memory and circuits for interfacing with input/output terminals;

the respectively active processing unit accessing a copy of a duplicated peripheral circuit, independendly of whether it belongs to its own or to the duplicated control unit, sending to the respective peripheral which it intends to access a respective selection signal used by said access circuit for extending to the selected peripheral circuit the bus of the respectively active processing unit; and the active processing unit performing synchronous write cycles in both copies of the peripheral data RAM, to allow fast recovery of an operating synchronism by said processing unit after being switched from standby to active.

2. The duplicate control and processing unit in accordance with claim 1, wherein:

said respectively active processing unit generates, both during read and write cycles, a pair of the peripheral selection signals directed to said access circuits of the peripheral data RAMs assigned to said control units, for performing synchronous write cycles and synchronous read cycles in both said peripheral data RAMs, for allowing fast recovery of the operating synchronism by the processing unit after being switched from standby to active operation; and the words read synchronously by the duplicate peripheral data RAMs are compared and, if a difference is detected therebetween, an alarm signal is generated for initiating necessary maintenance operations by the respectively active processing unit.

3. The duplicate control and processing unit in accordance with claim 1, wherein each of said processing units further includes:

- a peripheral selecting circuit connected to said bus for decoding information on said bus of the processing unit generating said selection signals for the access circuits of the peripherals;
- a failure detection and alarm generation circuit informing said respective processing unit of a presence of an internal failure alarm condition in its own processing unit or in main circuits of all associated telecommunications equipment to allow maintenance thereof by the respectively active processing unit; and
- a communications circuit defining a two-way synchronous communication channel between said processing units to allow an exchange of information therebetween.

4. The duplicate control and processing unit in accordance with claim 3, wherein each of said peripheral selection circuits further includes an auxiliary register in which the respective processing unit writes one of four possible bit combinations for setting a corresponding procedure for accessing said peripheral data RAMs in accordance with the following criteria:

- a first bit combination to perform a synchronous write cycle in both peripheral data RAMs and a read cycle only in a memory belonging to its own control unit;
- a second bit combination to perform a read and write cycle only in the peripheral data RAM belonging to its own control unit;
- a third bit combination to perform a read and write cycle only in the duplicate peripheral data RAM; and
- a fourth bit combination to perform a synchronous write cycle in both the peripheral data RAMs and a read cycle only in the duplicate peripheral data RAM;

and wherein

- said peripheral selection circuits are enabled by the respective copy selection signal in the active logical state, preventing the processing unit on standby from controlling said access circuits; and
- the respectively enabled peripheral selection circuit decodes the contents of a respective auxiliary register together with the signals on the busses of the respective processing units for generating a corresponding appropriate combination of the selection signal of the peripheral circuits.

5. The duplicate control and processing unit in accordance with claim 1, wherein each of said configuration control circuits includes a copy selection EPROM having address inputs receiving a copy selection signal coming from the configuration control circuit belonging to the duplicate processing unit, a first OR logic signal of an alarm detected by the respective processing unit and a second OR logic signal of an alarm detected by the duplicate processing unit, bits representative of a request for activation or putting on standby of said processing unit of which said EPROMs form a part, and words read for each configuration of addresses corresponding to a true or denied logical value of said copy selection signals.

6. The duplicate control and processing unit in accordance with claim 5, wherein signals on said address lines of said copy selection EPROMs are appropriately filtered so as to eliminate any disturbances and to allow control software to initiate attempts toward eliminating any cause of an alarm.

\* \* \* \* \*